United States Patent
Fackelmeier

(10) Patent No.: US 10,989,773 B2
(45) Date of Patent: Apr. 27, 2021

(54) LOCAL COIL AND WIRELESS ENERGY TRANSFER SYSTEM

(71) Applicant: Siemens Healthcare GmbH, Erlangen (DE)

(72) Inventor: Andreas Fackelmeier, Thalmässing (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/540,232

(22) Filed: Aug. 14, 2019

(65) Prior Publication Data
US 2020/0057125 A1  Feb. 20, 2020

(30) Foreign Application Priority Data

Aug. 16, 2018  (EP) ..................................... 18189310

(51) Int. Cl.
| | | |
|---|---|---|
| *G01R 33/36* | (2006.01) | |
| *H02J 50/10* | (2016.01) | |
| *H02J 50/40* | (2016.01) | |
| *G01R 33/3415* | (2006.01) | |

(52) U.S. Cl.
CPC ..... *G01R 33/3628* (2013.01); *G01R 33/3415* (2013.01); *G01R 33/3614* (2013.01); *H02J 50/10* (2016.02); *H02J 50/40* (2016.02)

(58) Field of Classification Search
CPC ............ G01R 33/3628; G01R 33/3415; G01R 33/3614; G01R 33/3692; G01R 33/385; H02J 50/10; H02J 50/40; A61B 5/055
See application file for complete search history.

(56) References Cited

U.S. PATENT DOCUMENTS

| | | | |
|---|---|---|---|
| 2009/0237079 A1 | 9/2009 | Van | |
| 2012/0313645 A1* | 12/2012 | Biber | ................. G01R 33/3692 324/322 |
| 2013/0342198 A1 | 12/2013 | Vester | |
| 2014/0218035 A1 | 8/2014 | Okamoto | |

FOREIGN PATENT DOCUMENTS

| | | |
|---|---|---|
| DE | 102012210507 B4 | 6/2016 |
| JP | 2017046797 A | 3/2017 |
| WO | WO2018060332 A1 | 4/2018 |

OTHER PUBLICATIONS

European Search Report for European Patent Application No. 18189310.8-1022 dated Apr. 3, 2019.

* cited by examiner

*Primary Examiner* — Susan S Lee
(74) *Attorney, Agent, or Firm* — Lempia Summerfield Katz LLC

(57) ABSTRACT

The disclosure relates to a local coil with an energy supply device, a system including an energy transmitting device and a local coil, and a method for operating the system. The local coil includes an energy store, a clock control system, and an energy receiving device for the wireless reception of energy from the energy transmitting device. The clock control system of the local coil is configured to be synchronized with an external clock source. The clock control system has a signal connection with the energy supply device and is configured to control energy take-up via the energy receiving device in dependence on the synchronization.

20 Claims, 3 Drawing Sheets

| | |
|---|---|
| 1 Magnetic resonance tomography scanner | 22 Radio-frequency unit |
| 2 Longitudinal direction | 23 Scanner control |
| 10 Magnet unit | 25 Signal bus |
| 11 Field magnet | 30 Patient bench |
| 12 Gradient coils | 36 Propulsion unit |
| 14 Body coil | 40 Energy transmitting device |
| 16 Patient tunnel | 41 Transmitting coil |
| 20 Control unit | 50 Local coils |
| 21 Gradient activation system | 100 Patient |

| 1 | Magnetic resonance tomography scanner | 22 | Radio-frequency unit |
| 2 | Longitudinal direction | 23 | Scanner control |
| 10 | Magnet unit | 25 | Signal bus |
| 11 | Field magnet | 30 | Patient bench |
| 12 | Gradient coils | 36 | Propulsion unit |
| 14 | Body coil | 40 | Energy transmitting device |
| 16 | Patient tunnel | 41 | Transmitting coil |
| 20 | Control unit | 50 | Local coils |
| 21 | Gradient activation system | 100 | Patient |

| 50 Local coil | 55 Energy supply device |
|---|---|
| 51 Antenna coil | 56 Clock control system |
| 52 Pre-amplifier | 57 Energy store |
| 53 AD converter | 58 Induction coil |
| 54 Transmitter | 59 Detuning device |

1 MRT scanner
16 Patient tunnel
40 Energy transmitting device
41 Transmitting coil
42 Clock source

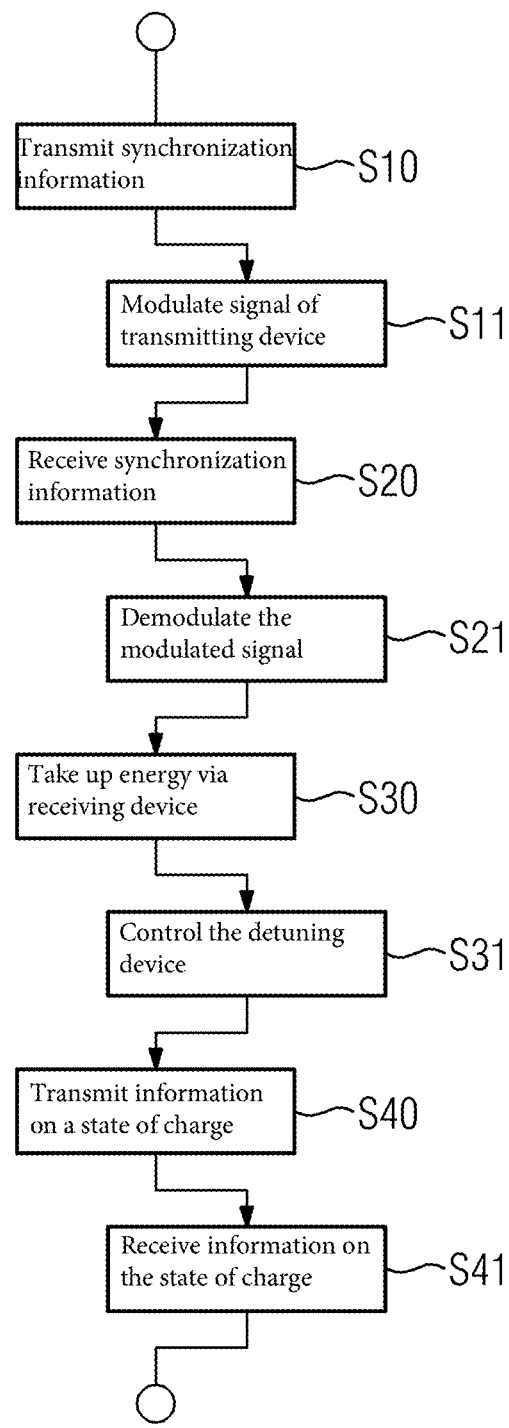

LOCAL COIL AND WIRELESS ENERGY TRANSFER SYSTEM

The present patent document claims the benefit of European Patent Application No. 18189310.8, filed Aug. 16, 2018, which is also hereby incorporated by reference.

TECHNICAL FIELD

The disclosure relates to a local coil, a system including a local coil, and an energy transmitting device for the wireless supply of energy to the local coil.

BACKGROUND

Magnetic resonance tomography scanners are imaging devices that, in order to image an object under examination, align nuclear spins of the object under examination with a strong external magnetic field and excite the nuclear spins by an alternating magnetic field to precess about this alignment. The precession or return of the spins from this excited state to a state with a lower energy in turn generates an alternating magnetic field, also called a magnetic resonance signal, as a response that is received via antennas.

Magnetic gradient fields are used to impart spatial encoding to the signals that subsequently enables the assignment of the received signal to a volume element. The received signal is then evaluated and three-dimensional imaging of the object under examination is provided. The image generated shows the spatial density distribution of the spins.

In order to improve the signal-to-noise ratio and accelerate image acquisition by parallel scanning, increasingly as many receiving antennas as possible are arranged in an antenna matrix structure, (called a local coil matrix), as close to the patient's body as possible. A cable connection may be used to transfer the signals received in the local coil or local coil matrix. The cables also function as antennas during the excitation pulse, however, thus necessitating the provision of special safety measures such as standing wave traps. In addition, the cables are cumbersome to handle.

Local coils are also available that convert or digitize the received magnetic resonance signals and transmit them to the magnetic resonance tomography scanner. However, batteries are required to supply the pre-amplifiers and converters, and these are only able to bridge a limited period and thus impede continuous operation of the magnetic resonance tomography scanner.

During the use of wireless energy transfer, there may, on the one hand, be interference to magnetic resonance signals and, on the other, frequently, a plurality of local coils are attached to the patient to provide that no changes are necessary during the examination, which is a waste of valuable examination time on the magnetic resonance tomography scanner. Herein, the wireless energy transfer of the local coils may result in mutual interference and disruption.

German Patent Application Publication No. DE 10 2012 210 507 B4 discloses a local coil for a magnetic resonance imaging system and a magnetic resonance imaging system, wherein the local coil or the magnetic resonance imaging system are embodied for the wireless transfer of operating energy or a reference signal.

SUMMARY AND DESCRIPTION

The scope of the present disclosure is defined solely by the appended claims and is not affected to any degree by the statements within this summary. The present embodiments may obviate one or more of the drawbacks or limitations in the related art.

It is an object of the present disclosure to provide a simple-to-handle local coil.

The local coil includes an energy supply device. The energy supply device is configured to supply consumers or active components of the local coil with energy during operation. Active components are, for example, pre-amplifiers such as low-noise amplifiers (LNAs), mixers, oscillators, A/D converters, or transmitters for transferring the received magnetic resonance signals to the magnetic resonance tomography scanner. The energy supply device may be configured to provide the complete transfer of all magnetic resonance signals for at least one image acquisition. Therefore, the energy supply appliance also includes an energy store configured to provide that transfer takes place, even in the case of interruptions or temporal breaks in the wireless energy supply. Examples of energy stores are disclosed herein.

The energy supply device further includes an energy receiving device, which is configured to take up energy from an external energy transmitting device in order to keep the consumers in the local coil in operation. Herein, interruptions to the wireless energy transfer are bridged by the energy store, wherein the energy receiving device recharges the energy store between these interruptions. An energy receiving device may be a coil, which receives energy from the energy transmitting device in the near field by induction without large-scale radiation of an electromagnetic wave into free space. Herein, 'without large-scale radiation' should be understood as meaning that less than 50%, 25%, 10%, 5%, or 1% of the transferred energy is radiated into space.

The local coil further includes a clock control system. The clock control system is configured to be synchronized with an external clock source, as described in detail below. The clock control system is connected to the energy supply device via a signal connection and is configured to control energy take-up via the energy receiving device in dependence on the synchronization. 'Control' may be understood to mean that the clock control system specifies time intervals in which the energy supply device takes up energy wirelessly. 'Dependence' may be understood to mean that the time point and/or the duration of the time interval is dependent on the synchronization.

Advantageously, the clock control system and the energy receiving device may predetermine when the local coil takes up energy wirelessly thus enabling interactions between a plurality of local coils to be avoided.

In one possible embodiment, the clock control system includes a synchronization input for synchronization with an external clock source. For example, it is conceivable for the clock control system to have an antenna for receiving a separate synchronization signal. It would also be possible for the clock control system to use the magnetic resonance tomography excitation pulses or gradient signals as a synchronization signal. Also conceivable would be an internal clock for the clock-pulse supply, which is only synchronized with the magnetic resonance tomography scanner at longer time intervals, for example in a charging tray. Finally, the magnetic resonance tomography scanner and clock control system may also be synchronized by an external third clock source.

Advantageously, the synchronization input enables synchronization of a plurality of local coils and the magnetic resonance tomography scanner thus enabling them to be operated simultaneously without mutual interference in the case of the wireless energy supply or overloading of the energy transmitting device.

In one conceivable embodiment of the local coil, the synchronization input has a signal connection with the energy receiving device. The synchronization input includes a demodulator, which is configured to demodulate an external synchronizing signal received from the energy receiving device and forward it to the clock control system.

The demodulator advantageously enables a synchronization signal to be transferred to the clock control system of the local coil without additional signal paths or radio frequencies that may disrupt operation.

In one conceivable embodiment of the local coil, the clock control system has a signal connection with a wireless communication device. Herein, the clock control system or the energy supply device is configured to transmit information on a state of charge of the energy store via the communication device. For example, the information may be transferred together with an MRI signal using frequency-division multiplexing, time-division multiplexing and/or digitally. However, transfer using an independent bidirectional wireless transfer for control commands that may work with a lower bandwidth is also conceivable.

Advantageously, information on the state of charge enables the energy supply for a plurality of local coils to be optimally coordinated thus enabling an energy transmitting device to cope with lower power.

In one possible embodiment, the energy receiving device of the local coil includes an induction coil with a detuning device and the clock control system is configured to control the detuning device. The detuning device may be implemented by switchable capacitors or inductors. Radio-frequency switches such as PIN diodes that short-circuit or open the circuit or line are also conceivable. The induction coil may be configured to withdraw energy in the alternating magnetic field of a corresponding transmitting coil resonantly by induction. The clock control system may be configured to detune the induction coil at the time intervals in which other clock control systems of other local coils switch off their detuning for the wireless energy transfer.

The detuning device switched by the clock control system advantageously avoids interaction between the plurality of induction coils in different local coils which would result in detuning due to coupling of a plurality of resonant oscillating circuits and hence impaired energy transfer.

In one conceivable embodiment, the local coil includes a capacitor, a supercap, or a rechargeable battery as an energy store. Also conceivable is a combination of a fast-charging energy store and a high-capacity energy store, such as, for example, a supercap and a lithium cell in order to combine a short charging time with high capacity.

These chargeable energy stores are advantageously able to provide the energy supply for the local coil during short or even lengthy interruptions to the wireless energy transfer. Herein, capacitors and supercaps are recharged in a very short time, while supercaps and chargeable batteries are also able to bridge longer pauses in the energy transfer.

A system includes a plurality of local coils, an energy transmitting device, and a clock source. The clock source is configured to transmit a clock signal to the clock control systems of the local coils. Herein, the clock signal is configured so that only a genuine subset of local coils takes up energy simultaneously via the energy receiving device. In other words, coding in the clock signal in conjunction with the clock control systems of the local coils provides that only one or some of the local coils simultaneously receive energy wirelessly. For example, the clock signal may include a counter in a loop and the local coils individual numbers thus providing that energy transfer due to deactivation of the detuning device only takes place when the counter and number match.

In one conceivable embodiment of the system, the clock source has a signal connection with the energy transmitting device and is configured to modulate the emission of energy from the energy transmitting device. For example, the amplitude or frequency may be modulated in order to transfer a counter in digitally encoded form.

Advantageously, this enables the local coils to be synchronized with the clock source without additional signals.

One conceivable embodiment of a method for operating the system includes the act of transmitting synchronization information by the clock source. For example, the signal may be modulated for the energy transfer or a wireless interface used to control the local coil.

In a further act, the synchronization information is received by the clock control system of the local coil. To this end, the energy receiving device may demodulate a signal used for energy transfer and thus forward a modulated synchronizing signal to the clock control system via a signal connection. It is also possible, to control the local coil, for an additional wireless communication interface to be provided which receives the synchronizing signal and forwards it via a signal connection to the clock control system.

In another act, the energy supply device controls energy take-up via the energy receiving device in dependence on the synchronization information. For example, it is conceivable for the energy control to implement the energy take-up at a time point or duration determined by the synchronization information.

Advantageously, the method with the system enables the energy take-up of a plurality of local coils to be coordinated and uniform distribution of the load to be achieved.

In one possible embodiment of the method, the act of energy take-up includes the act of changing the status of the detuning device.

Advantageously, this enables the induction coil only to be matched to the signal that transfers the energy wirelessly during energy take-up. On the other hand, during the remaining time, the induction coil is detuned thus providing that there are no unwanted interactions, such as detuning due to the coupling of different local coils, that reduce the efficiency of the energy transfer.

In one conceivable embodiment of the method, the synchronization input of the local coil includes a demodulator and has a signal connection with the energy receiving device. The clock source of the system has a signal connection with the energy transmitting device. Herein, the act of transmitting includes the act of modulating the energy emission of the energy transmitting device with the synchronization information of the clock source and the act of receiving includes the act of demodulating the signal received from the energy transmitting device with the demodulator and forwarding the received synchronization information to the clock control system.

The transfer of the synchronization information by the signal used for the energy transfer advantageously saves on an additional wireless communication path which may be a source of interference.

In one possible embodiment of the method, the local coil includes a wireless communication device that has a signal connection with the clock control system. The method includes the act of transmitting information on a state of charge of the energy store via the communication device.

For example, a narrow-band communication device may be provided via radio with which the wireless local coil receives setting commands and transmits status information. It is also conceivable for the information on the wireless connection to be time-division multiplexed, frequency-division multiplexed, or digitally multiplexed with the magnetic resonance signals. Advantageously, this enables the clock control system to optimize the charging of the individual local coils thus enabling the power requirement of the energy transmitting device and SAR exposure to be minimized.

In one conceivable embodiment of the method, the clock source receives the information on the state of charge in one act and in the act of transmitting changes the emitted synchronizing signal in dependence on the information on the state of charge.

Advantageously, this enables the clock source to match the charging of the local coils to the state of charge of the local coils and accelerate or optimize this.

BRIEF DESCRIPTION OF THE DRAWINGS

The above-described properties, features and advantages of this disclosure and the manner in which these are achieved will become clear and more plainly comprehensible in conjunction with the following description of the exemplary embodiments explained in more detail in conjunction with the drawings.

FIG. 4 depicts a schematic flowchart of a method.

DETAILED DESCRIPTION

Figure 1:
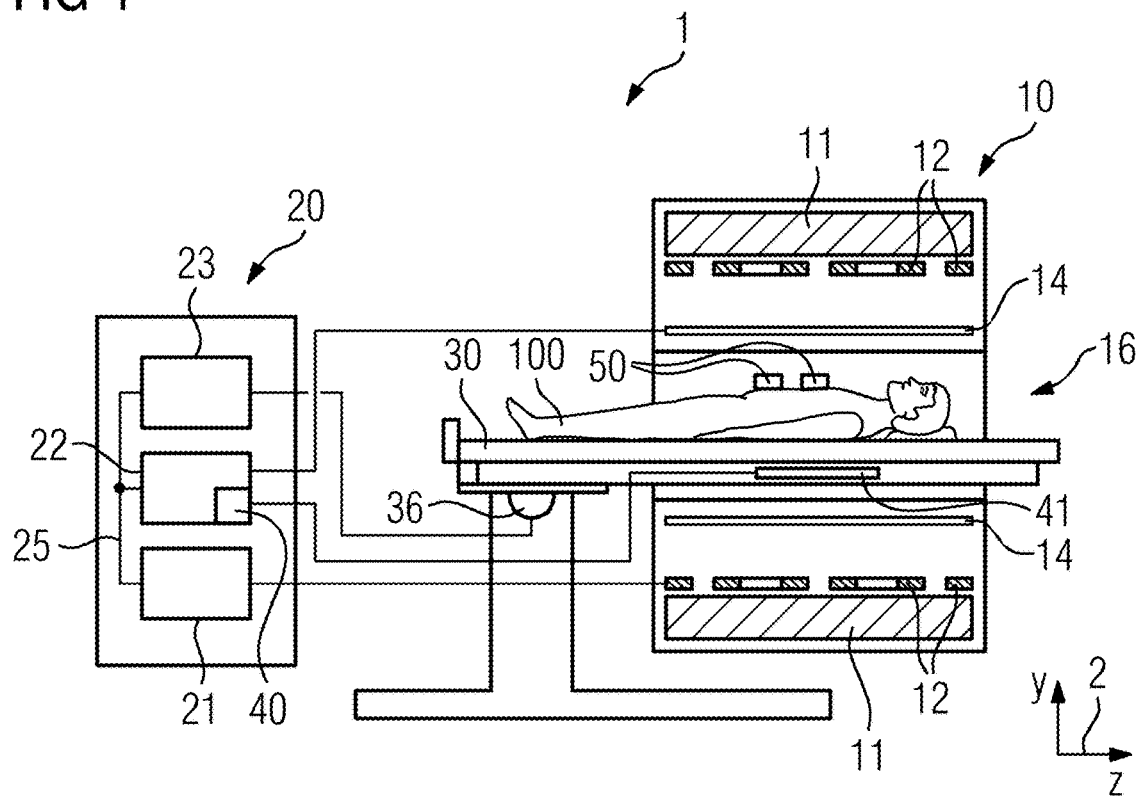
FIG. 1 depicts an exemplary schematic depiction of a magnetic resonance tomography scanner with an antenna.

FIG. 1 depicts a schematic depiction of an exemplary embodiment of a magnetic resonance tomography scanner 1 with a system.

The magnet unit 10 includes a field magnet 11 that generates a static magnetic field B0 for the alignment of nuclear spins in specimens or patients 100 in a recording region. The recording region is arranged in a patient tunnel 16 extending in a longitudinal direction 2 through the magnet unit 10. A patient 100 may be moved by the patient bench 30 and the propulsion unit 36 of the patient bench 30 into the recording region. The field magnet 11 may be a superconducting magnet able to provide magnetic fields with a magnetic flux density of up to 3 T, or even more with the most recent devices. However, it is also possible to use permanent magnets or electromagnets with normally conducting coils for lower field strengths. Low field strengths may be cheaper to realize and, with modern image acquisition methods, still provide satisfactory results. These are, for example, field strengths of 1.5 tesla, 1 tesla, or 0.5 tesla.

The magnet unit 10 also includes a body coil 14 configured to emit a radio-frequency signal supplied via a signal line into the examination volume and to receive resonance signals emitted by the patient 100 and emit them via a signal line. However, for the reception of the radio-frequency signal, the body coil 14 may be replaced by local coils 50 arranged in the patient tunnel 16 close to the patient 100. However, it also in principle conceivable for the local coil 50 to be configured to transmit and receive.

A control unit 20 supplies the magnet unit 10 with the signals for the body coil 14 and evaluates the received signals. Herein, a magnetic resonance tomography scanner control 23 coordinates the subunits. For example, the control unit 20 includes a gradient activation system 21 configured to supply the gradient coils 12 with variable currents via feed lines wherein said currents provide the desired gradient fields in the examination volume in temporal coordination.

The control unit 20 includes a radio-frequency unit 22, which is configured to generate a radio-frequency pulse with a prespecified temporal course, amplitude and spectral power distribution to excite a magnetic resonance of the nuclear spins in the patient 100. Herein, a pulse power in the kilowatt range may be achieved. The individual units are interconnected via a signal bus 25.

The radio-frequency signal generated by the radio-frequency unit 22 is supplied via a signal connection of the body coil 14 and emitted into the body of the patient 100 in order to excite the nuclear spins there. Also conceivable are separate transmitting coils, which may be arranged on the patient's body.

The local coils 50 then receive a magnetic resonance signal from the body of the patient 100 because, due to the short distance, the signal-to-noise ratio (SNR) of the local coil 50 is better than when received by the body coil 14. The MR signal received by the local coils 50 is processed in the local coil 50 and forwarded to the radio-frequency unit 22 of the magnetic resonance tomography scanner 1 for evaluation and image acquisition.

Magnetic resonance signals may be transferred from the local coil via cables, (e.g., coaxial cables), to the magnetic resonance tomography scanner 1. However, the metallic conductors also act as antennas during the excitation pulses. Therefore, in order to avoid high induced voltages, standing wave traps may be provided along the cables to prevent the patient being endangered. To avoid these bulky connection lines, wireless signal transfer methods are increasingly being considered. However, because the local coil 50 also includes active elements such as pre-amplifiers, converters and transmitters for the transfer, an energy supply without a wired connection is required.

In order to be able to provide the wireless energy supply, the magnetic resonance tomography scanner 1 includes an energy transmitting device 40 with which an alternating current may be generated, which, for example, generates an alternating magnetic field on flowing through a transmitting coil 41. To this end, the transmitting coil 41 may be arranged in the vicinity of the patient tunnel 16. It is also conceivable for the transmitting coil 41 to be provided in the patient bench 30.

A highest possible alternating current in the transmitting coil 41 and hence a strong alternating field and high energy transfer in an induction coil 58 of a local coil 50 may be achieved if herein the transmitting coil 41 is part of a resonant circuit the resonant frequency of which is the frequency of the alternating current of the energy transmitting device. Together with a resonant circuit with the same frequency in the local coil 50, a particularly effective energy transfer may be provided. Suitable matching to the generator of the alternating current also advantageously enables the reduction of unwanted radiation of the energy as a free electromagnetic wave.

However, if there are two or more local coils 50 with resonant circuits with the same frequency in the patient tunnel 16, these interact via the magnetic field. According to the theory of coupled resonant circuits, the resonant frequencies then split, thus providing none of the resonant circuits remains at the original resonant frequency and the energy transfer loses significant power.

Figure 2:
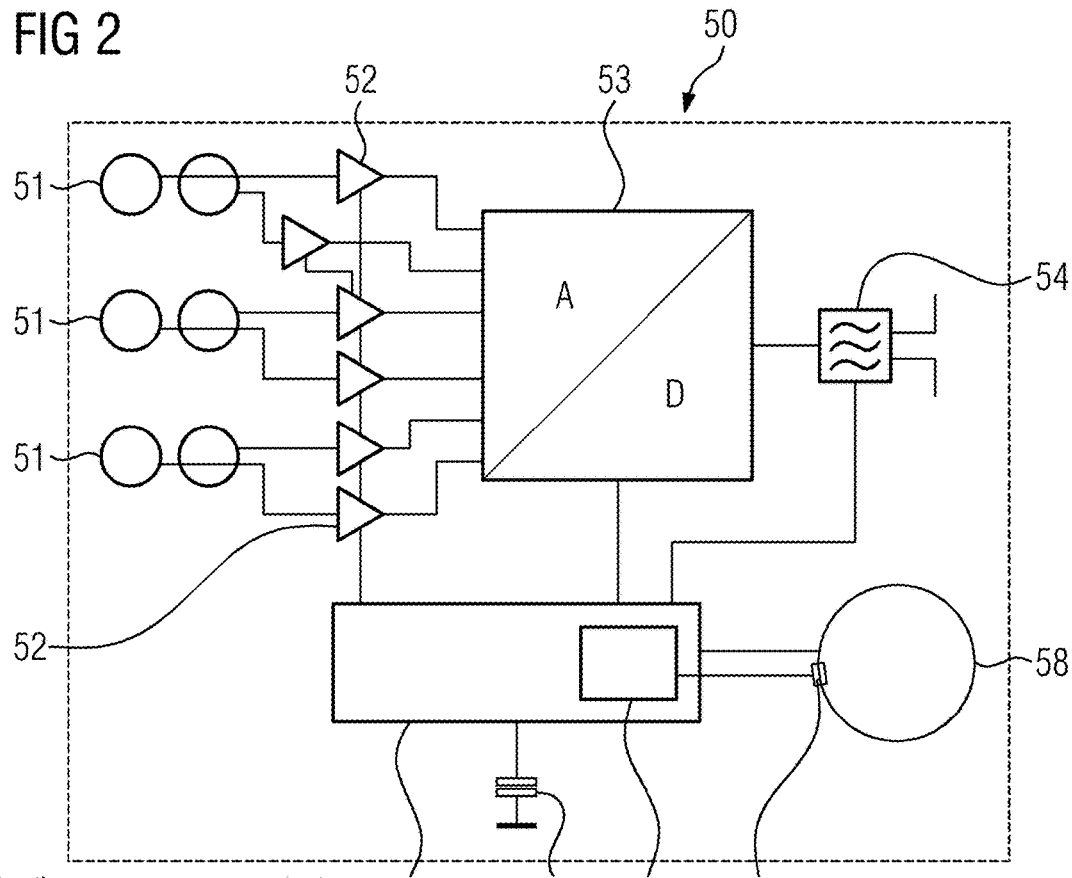
FIG. 2 depicts an exemplary schematic depiction of a local coil.

The local coil 50 depicted in FIG. 2 with an energy supply 55 and a clock control system 56 resolves this problem in that, acting in conjunction with a clock source 42, the clock control system in the magnetic resonance tomography scanner 1 provides that the resonant circuits of the local coils 50 do not interact with one another.

The local coil 50 includes one or more antenna coils 51 in which a magnetic resonance signal is taken up from the body of the patient 100. The magnetic resonance signal is amplified by pre-amplifiers 52, also called low-noise amplifiers LNAs. In one possible embodiment, the magnetic resonance signal is digitized directly by an A/D converter 53. However, it is also conceivable for the magnetic resonance signal to be frequency-converted first. After conversion, the magnetic resonance signal may be further transferred to one or more intermediate frequencies as an analog signal even without AD conversion. For the wireless transfer, a transmitter 54 provided in the local coil 50 modulates the analog or digital signal(s) to a carrier wave and emits it/them via an antenna. Due to the required bandwidth for all magnetic resonance signals, the frequency range of the carrier wave may be in the gigahertz range.

The operation of the active components, such as preamplifiers 52, AD converters 53, transmitters 54 or possible units, which are not depicted, such as oscillators and mixers requires energy in the form of electric current. The supply is provided by an energy supply device 55 of the local coil 50. The energy supply device 55 receives the energy wirelessly via an energy receiving device, for example via an induction coil 58 by interaction with an alternating magnetic field generated by an energy transmitting device 40 of the magnetic resonance tomography scanner 1. To provide that the energy transfer is as efficient as possible, during the energy transfer, the induction coil 58 is resonantly tuned to the frequency of the alternating magnetic field. However, at higher frequencies, dipole antennas or a conductive surface are, for example, also conceivable in the case of capacitive transfer by alternating electric fields.

The alternating current in the induction coil induced by the alternating magnetic field is then rectified in the energy supply device 55 and may be stored temporarily in an energy store 57 in order to bridge interruptions to the wireless energy transfer. Herein, depending upon the time to be bridged, the energy store 57 may include capacitors, electrolytic capacitors known as supercaps with capacitances of up to a farad or also chargeable batteries such as, for example, lithium-ion, lithium-polymer or lithium-ferrophosphate batteries. Herein, it is also conceivable, in a combination of supercap and battery, for the supercap to temporarily store a large amount of energy and then deliver it to the battery to provide a permissible charging current is not exceeded.

The energy supply device 55 then delivers the current continuously to the consumers. Herein, it is conceivable for the voltage to be stabilized by a low-interference in-phase control or for a step-up converter with special interference suppression measures to keep the voltage constant even in the case of a decreasing input value. Measures for interference suppression can, for example, include the selection of a special frequency for the converter or acting in conjunction with clock control system explained below.

The energy supply device 55 further includes a clock control system 56. The clock control system 56 is configured to be synchronized with an external clock source 42. To this end, it is, for example, conceivable for the alternating magnetic field of the energy transmitting device 40 to be modulated with synchronization information. A demodulator in the energy supply device 55 may demodulate the synchronizing signal and feed it to the clock control system 56. However, it is also conceivable for the transfer to take place separately on another frequency. For example, a narrow-band wireless signal connection may be provided to control the local coil 50 with which the synchronizing signal is transferred. The frequency thereof may also be within the range of a few kilohertz or megahertz. It is also possible for the clock control systems 56 of different local coils 50 to be synchronized by the excitation pulses of the sequences as synchronization information.

The clock control system 56 of the energy supply device 55 of the local coil has a signal connection with a detuning device 59 of the induction coil 58. Herein, the detuning device 59 is configured to detune the induction coil 58 so that the latter is not coupled at all or coupled to a lesser degree to the alternating magnetic field of the energy transmitting device 40 and the wireless energy transfer is reduced or stopped. This enables the clock control system 56 to control energy take-up via the energy supply device. The detuning device 59 may include a series capacitor or inductor which may be short-circuited or disconnected from the clock control system by a switch such as a PIN diode. Also conceivable are other circuits, such as parallel reactors with corresponding switches.

In conjunction with the synchronization, the clock control system 56 detunes the induction coil 58 such that the local coils 50 do not all receive energy simultaneously. At each point in time, energy may be only taken up by one single local coil 50. This enables it to be provided that the induction coils 58 of different local coils 50 do not interact with one another via the magnetic field and, on energy take-up with an unchanged, optimal resonant frequency, energy is transferred as efficiently as possible.

It is conceivable, for example, for the clock control system 56 to be synchronized in that the synchronization information, (e.g., a pulse or level change), causes counters in the clock control systems 56 of all local coils 50 to be synchronized. It is then, for example, conceivable for the last position of a number or a serial number of a local coil 50 to be compared with the counter and in each case for energy transfer only to take place with the local coil 50 of which the last position currently coincides with the counter reading. Also conceivable are other algorithms such as modulo or bit operations. The number of the respective local coil 50 may also be set or specified via a setting command by the magnetic resonance tomography scanner 1 thus enabling accesses at the same time to be excluded and unused time slots to be avoided. It is also conceivable for the synchronization information directly to contain the number of a local coil 50 that is allowed to charge in the next time slot or for a charge command to be transmitted with the synchronization information to a specific local coil 50.

Also possible is a solution with which the energy supply device 55 forwards a state of charge of the energy store 57 to the clock source 42 of the magnetic resonance tomography scanner 1 via a communication device. The communication device may be a narrow-band wireless communication interface via which the magnetic resonance tomography scanner exchanges status information or setting commands with the local coil 50. However, it is also conceivable for the state of charge to be multiplexed with digital magnetic resonance signals, for example. In one advantageous exemplary embodiment, the clock control system 56 matches the synchronization information to the state of charge, thus enabling, for example, the local coil 50 with the lowest state of charge to be given preference for charging in that it is assigned more time slots. This may be achieved in that the number of the local coil 50 is repeated more frequently as synchronization information or direct charging commands are transmitted from the clock source 42 to the local coil 50.

Figure 3:
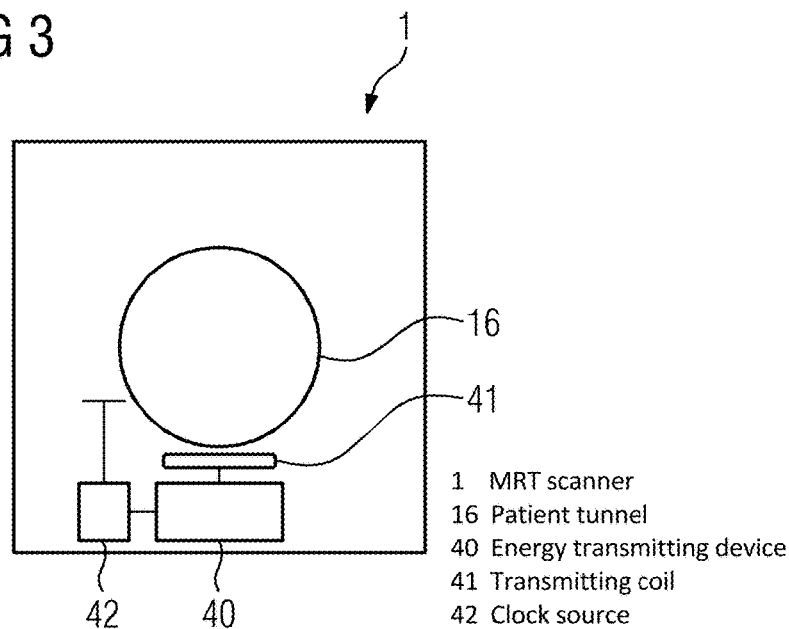
FIG. 3 depicts an exemplary schematic depiction of a magnetic resonance tomography scanner with an energy transmitting device.

FIG. 3 again depicts the corresponding energy transmitting device 40 of the magnetic resonance tomography scanner 1.

The magnetic resonance tomography scanner 1 includes an energy transmitting device 40, which is configured to provide the energy for the wireless energy supply. For example, the energy transmitting device 40 may include an oscillator and a power amplifier with which an alternating radio-frequency current is generated. The alternating radio-frequency current is fed into an antenna, (e.g., a transmitting coil 41), arranged in the vicinity of the patient tunnel 16. Herein, targeted mismatching between the transmitting coil 41 and the system including the energy transmitting device and the feed line to the transmitting coil 41 may provide that energy transfer only takes place by induction in the near field without large portions of the transmission energy being radiated into space as a free radio wave. This may reduce SAR exposure and simplify regulatory approval.

The frequency of the alternating current generated by the energy transmitting device 40 may be selected to provide that harmonic waves do not coincide with the frequencies of the magnetic resonance signal or an intermediate frequency used in the subsequent evaluation.

In one conceivable embodiment, the clock source 42 has a signal connection with the energy transmitting device 40. Herein, the energy transmitting device 40 is configured to modulate the alternating radio-frequency current with synchronization information from the clock control system thus enabling this to be received from the energy supply device 55 of the local coil 50 and forwarded to the clock control system 56.

In other exemplary embodiments, it is also conceivable for the synchronization information to be emitted by the clock source 42 itself via an antenna or transferred wirelessly via a control channel of the magnetic resonance tomography scanner 1 to the local coil 50.

Depending upon the exemplary embodiment, the clock source 40 may be a simple clock generator or also a complex control system with its own processor that evaluates information communicated by the local coils 50 on a state of charge of the energy store 57 and, for example, matches the synchronization information such that a local coil 50 with a low state of charge is given preference for the supply of energy.

Herein, it is conceivable for the clock source 42 to be embodied as independent hardware. However, it is also possible for the clock source 42 to be embodied as a program on a control system of the magnetic resonance tomography scanner 1.

FIG. 4 is an example of a flowchart of a method.

In act S10, the clock source 42 transmits synchronization information. It is, for example, conceivable for the synchronization information to be transmitted via a wireless control channel of the magnetic resonance tomography scanner, for the clock source 42 itself to include a transmitter for wireless transmission or also for the signal of the energy transmitting device to be modulated with the synchronization information by the clock source in sub-act S11.

In act S20, the clock control system 56 receives the synchronization information. Herein, it is for example conceivable, in sub-act S21, for the energy supply device 55 to demodulate the modulated signal received from the energy transmitting device 42 with the demodulator and to forward the received synchronization information to the clock control system 56.

In act S30, the energy supply device 55 takes up energy via the energy receiving device in dependence on the synchronization information. The energy receiving device may be an induction coil 58 with a detuning device 59. In sub-act S31, the clock control system 56 controls the detuning device 59 directly or via the energy supply device 55 such that the induction coil 58 is resonant to an alternating magnetic field generated by the energy transmitting device.

In one exemplary embodiment of the method, it is also conceivable, in act S40, for the energy supply device 55 to transmit information on a state of charge of the energy store 57 via the communication device, for example, multiplexed with the magnetic resonance signals in a data stream or in a separate wireless back channel.

In act S41, the clock source 42 may receive the information on the state of charge and change the synchronization information emitted in act S10 in dependence on the information on the state of charge.

Although the disclosure was illustrated and described in more detail by the exemplary embodiments, the disclosure is not restricted by the disclosed examples and other variations may be derived herefrom by the person skilled in the art without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method for operating a system having an energy transmitting device, a clock source, and a plurality of local coils, the method comprising:
   transmitting synchronization information by the clock source;
   receiving the synchronization information by a clock control system of a local coil of the plurality of local coils; and
   taking up energy by an energy supply device of the local coil of the plurality of local coils via an energy receiving device of the local coil of the plurality of local coils in dependence on the synchronization information.

2. The method of claim 1, wherein the taking up of energy comprises changing a status of a detuning device of an induction coil of the energy receiving device.

3. The method of claim 1, wherein the transmitting comprises modulating energy emission of the energy transmitting device with the synchronization information, and
   wherein the receiving comprises demodulating a synchronization signal received from the energy transmitting device with a demodulator and forwarding the synchronization information to a clock control system.

4. The method of claim 1, further comprising:
transmitting information on a state of charge of an energy store of the local coil of the plurality of local coils via a wireless communication device.

5. The method of claim 4, wherein the clock source receives the information on the state of charge and changes the synchronization information transmitted by the clock source in dependence on the information on the state of charge.

6. A local coil apparatus comprising:
an energy supply device having an energy store;
a clock control system; and
an energy receiving device configured to wirelessly receive energy from an external energy transmitting device,
wherein the clock control system is configured to be synchronized with an external clock source, and
wherein the clock control system has a signal connection with the energy supply device and is configured to control energy take-up via the energy receiving device in dependence on the synchronization of the clock control system with the external clock source.

7. The local coil apparatus of claim 6, wherein the clock control system comprises a synchronization input for the synchronization with the external clock source.

8. The local coil apparatus of claim 7, wherein the synchronization input comprises a signal connection with the energy receiving device and a demodulator configured to demodulate an external synchronizing signal received from the energy receiving device.

9. The local coil apparatus of claim 7, wherein the clock control system comprises a signal connection with a wireless communication device, and
wherein the clock control system or the energy supply device is configured to transmit information on a state of charge of the energy store via the wireless communication device.

10. The local coil apparatus of claim 7, wherein the energy receiving device comprises an induction coil having a detuning device, and
wherein the clock control system is configured to control the detuning device.

11. The local coil apparatus of claim 10, wherein the energy store comprises a capacitor, a supercap, a chargeable battery, or a combination thereof.

12. The local coil apparatus of claim 7, wherein the energy store comprises a capacitor, a supercap, a chargeable battery, or a combination thereof.

13. The local coil apparatus of claim 6, wherein the energy receiving device comprises an induction coil having a detuning device, and
wherein the clock control system is configured to control the detuning device.

14. The local coil apparatus of claim 6, wherein the energy store comprises a capacitor, a supercap, a chargeable battery, or a combination thereof.

15. A system comprising:
an energy transmitting device;
a clock source; and
a plurality of local coils, each local coil having:
an energy supply device having an energy store;
a clock control system; and
an energy receiving device configured to wirelessly receive energy from the energy transmitting device,
wherein the clock control system is configured to be synchronized with the clock source, and
wherein the clock control system has a signal connection with the energy supply device and is configured to control energy take-up via the energy receiving device in dependence on the synchronization of the clock control system with the clock source,
wherein the clock source is configured to transmit synchronization information to the clock control systems of the plurality of local coils such that only a genuine subset of the plurality of local coils simultaneously takes up energy via the energy receiving device.

16. The system of claim 15, wherein the clock source comprises a signal connection with the energy transmitting device and is configured to modulate energy emission from the energy transmitting device.

17. The system of claim 15, wherein the clock control system comprises a synchronization input for the synchronization with the clock source.

18. The system of claim 17, wherein the synchronization input comprises a signal connection with the energy receiving device and a demodulator configured to demodulate an external synchronizing signal received from the energy receiving device.

19. The system of claim 15, wherein the energy receiving device comprises an induction coil having a detuning device, and
wherein the clock control system is configured to control the detuning device.

20. The system of claim 15, wherein the energy store comprises a capacitor, a supercap, a chargeable battery, or a combination thereof.

* * * * *